(12) United States Patent
Ren et al.

(10) Patent No.: US 11,758,748 B2
(45) Date of Patent: Sep. 12, 2023

(54) PEROVSKITE LIGHT-EMITTING DIODE WITH ADJUSTABLE LIGHT FIELD

(71) Applicant: Anhui University, Anhui (CN)

(72) Inventors: Xingang Ren, Anhui (CN); Qing Ci, Anhui (CN); Zhixiang Huang, Anhui (CN); Kaikun Niu, Anhui (CN); Ming Fang, Anhui (CN); Guangshang Cheng, Anhui (CN); Lixia Yang, Anhui (CN)

(73) Assignee: Anhui University, Hefei (CN)

( * ) Notice: Subject to any disclaimer, the term of this patent is extended or adjusted under 35 U.S.C. 154(b) by 149 days.

(21) Appl. No.: 17/469,833

(22) Filed: Sep. 8, 2021

(65) Prior Publication Data
US 2021/0408424 A1    Dec. 30, 2021

(30) Foreign Application Priority Data
Nov. 5, 2020 (CN) .......................... 202011223232.5

(51) Int. Cl.
*H10K 50/16* (2023.01)
*H10K 50/85* (2023.01)
*H10K 50/135* (2023.01)
*H10K 50/80* (2023.01)
*H10K 101/00* (2023.01)

(52) U.S. Cl.
CPC ........... *H10K 50/135* (2023.02); *H10K 50/16* (2023.02); *H10K 50/85* (2023.02); *H10K 50/868* (2023.02); *H10K 2101/80* (2023.02)

(58) Field of Classification Search
CPC ............... H10K 50/16–167; H10K 50/85–858
See application file for complete search history.

(56) References Cited

U.S. PATENT DOCUMENTS

2002/0180348 A1* 12/2002 Oda ....................... H10K 50/85
313/506

FOREIGN PATENT DOCUMENTS

| CN | 107293647 A | 10/2017 |
| CN | 107316940 A | 11/2017 |
| CN | 111384255 A | 7/2020 |

* cited by examiner

*Primary Examiner* — Daniel P Shook

(57) ABSTRACT

This disclosure provides a perovskite light-emitting diode with an adjustable light field, including a glass layer, an anode, a hole transport layer, an emission layer, an electron transport layer and a cathode in sequence from top to bottom. The electron transport layer is provided with a periodic nano-grating structure.

8 Claims, 8 Drawing Sheets

PEROVSKITE LIGHT-EMITTING DIODE WITH ADJUSTABLE LIGHT FIELD

CROSS-REFERENCE TO RELATED APPLICATIONS

This application claims the benefit of priority from a Chinese patent application No. 202011223232.5, filed on Nov. 5, 2020. The content of the aforementioned application, including any intervening amendments thereto, is incorporated herein by reference in its entirety.

TECHNICAL FIELD

This application relates to optoelectronic devices, and more particularly to a perovskite light-emitting diode with an adjustable light field.

BACKGROUND

The metal halide perovskite has emerged as a promising material for light-emitting diodes in the fields of lighting and display owing to its superior photoelectric performances, such as high photoluminescence quantum efficiency, narrow emission bandwidth, excellent color purity and tunable brightness over the visible spectrum, etc. At present, extensive researches have been conducted on parameters of the perovskite light-emitting diodes, including luminous efficiency, chromaticity and color stability; however, the directionality of the emitted light has rarely been investigated.

In the practical application, it is of great significance to prepare a perovskite light-emitting diode with an adjustable light field. On one hand, the light emitted from the planar perovskite light-emitting diode has the characteristics of Lambertian radiation mode, that is, the emitted light is uniform without a specific direction, which results in the loss of most photons in the waveguide mode, limiting the efficiency of light extraction. On the other hand, the control of the emission directionality has potential application prospects in the fields of biosensor and visible light communication.

SUMMARY

To solve the above technical problems, this application provides a perovskite light-emitting diode with an adjustable light field, comprising:
 a glass layer;
 an anode;
 a hole transport layer;
 an emission layer;
 an electron transport layer; and
 a cathode;
wherein the glass layer, the anode, the hole transport layer, the emission layer, the electron transport layer and the cathode are successively arranged from top to bottom; and the electron transport layer is provided with a periodic nano-grating structure.

Through introducing a nano-grating structure into the electron transport layer, the directionality of the light emitted from the perovskite light-emitting diode can be effectively controlled.

In some embodiments, the periodic nano-grating structure is a dielectric periodic nano-grating structure.

In an embodiment, the dielectric periodic nano-grating structure is a periodic ZnO nano-grating structure.

In some embodiments, the periodic nanograting structure is a metallic periodic nano-grating structure.

In an embodiment, the metallic periodic nano-grating structure is a periodic Ag nanograting structure.

In some embodiments, the periodic nano-grating structure consists of a dielectric periodic nano-grating structure and a metallic periodic nano-grating structure.

In some embodiments, the periodic ZnO nano-grating structure has a duty ratio of 0.4-0.6 and a height of 30-50 nm.

In some embodiments, the emission layer is provided with a horizontally polarized light source.

In some embodiments, the emission layer is provided with a vertically polarized light source.

In some embodiments, with regard to the perovskite light-emitting diode in which the electron transport layer is provided with the dielectric periodic nano-grating structure, the closer the light source gets to the cathode in a vertical direction, the better the light extraction efficiency. The emission layer is provided with a light source close to the cathode in a vertical direction.

In some embodiments, with regard to the perovskite light-emitting diode in which the electron transport layer is provided with the metallic periodic nano-grating structure, the closer the light source gets to the metallic periodic nano-grating structure in a horizontal direction, the better the light extraction efficiency. With regard to the perovskite light-emitting diode in which the electron transport layer is provided with the metallic periodic nano-grating structure, when the light source is arranged directly above the metallic periodic nano-grating structure, the light extraction efficiency is optimal. With regard to the perovskite light-emitting diode in which the electron transport layer is provided with the dielectric periodic nano-grating structure and the metallic periodic nano-grating structure, when the light source is arranged directly above the metallic periodic nano-grating structure, the light extraction efficiency is optimal.

In some embodiments, the electron transport layer is provided with the periodic dielectric periodic nano-grating structure or the metallic periodic nano-grating structure with variable period. Though adjusting the period of the nano-grating structure, a modulation range of an emission angle of the light emitted from the light source is 0-70°.

The technical effects and advantages of the present disclosure are described below.

The perovskite light-emitting diode provided herein, introduces a nano-grating structure, which can effectively damage the waveguide mode of the light when traveling through the device, and couple the waveguide mode into the substrate mode to increase the efficiency of light extraction. In addition, the angle of the emitted light can be adjusted continuously by adjusting the parameters of the grating such as period, remarkably enhancing the performance of the perovskite light-emitting diode.

Figure 1:
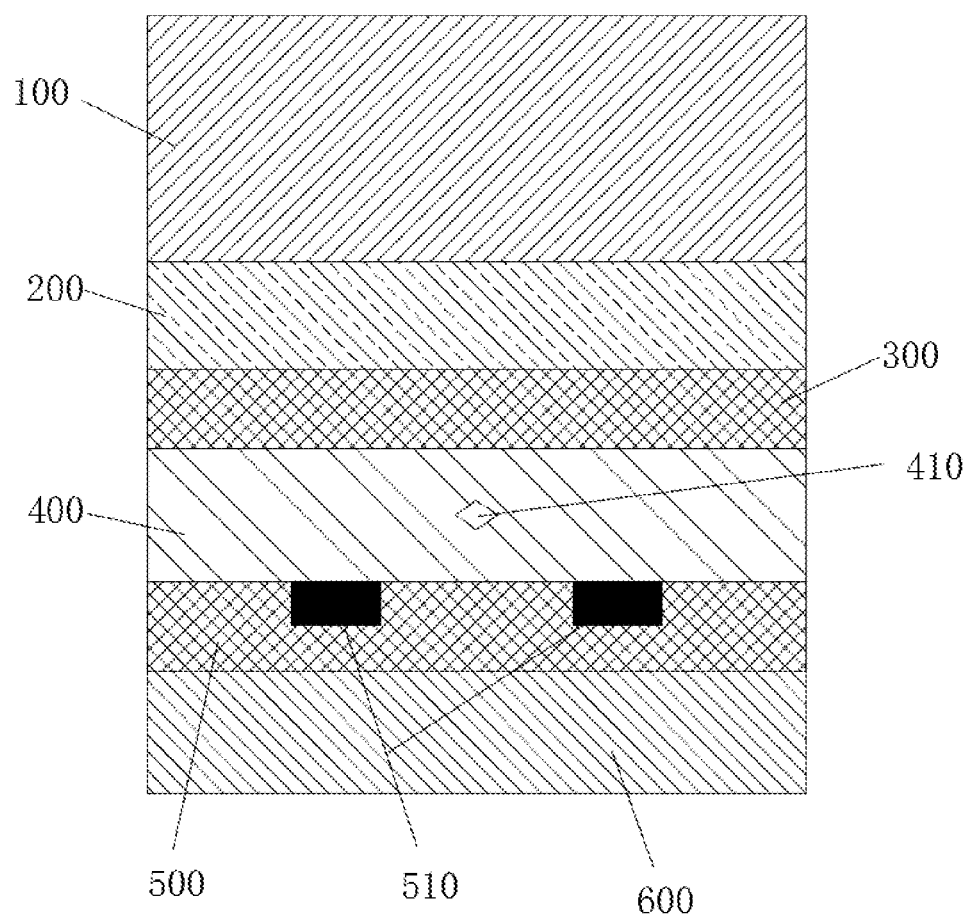
FIG. 1 schematically shows a layered structure of a perovskite light-emitting diode with an adjustable light field according to an embodiment of the disclosure.
Figure 2:
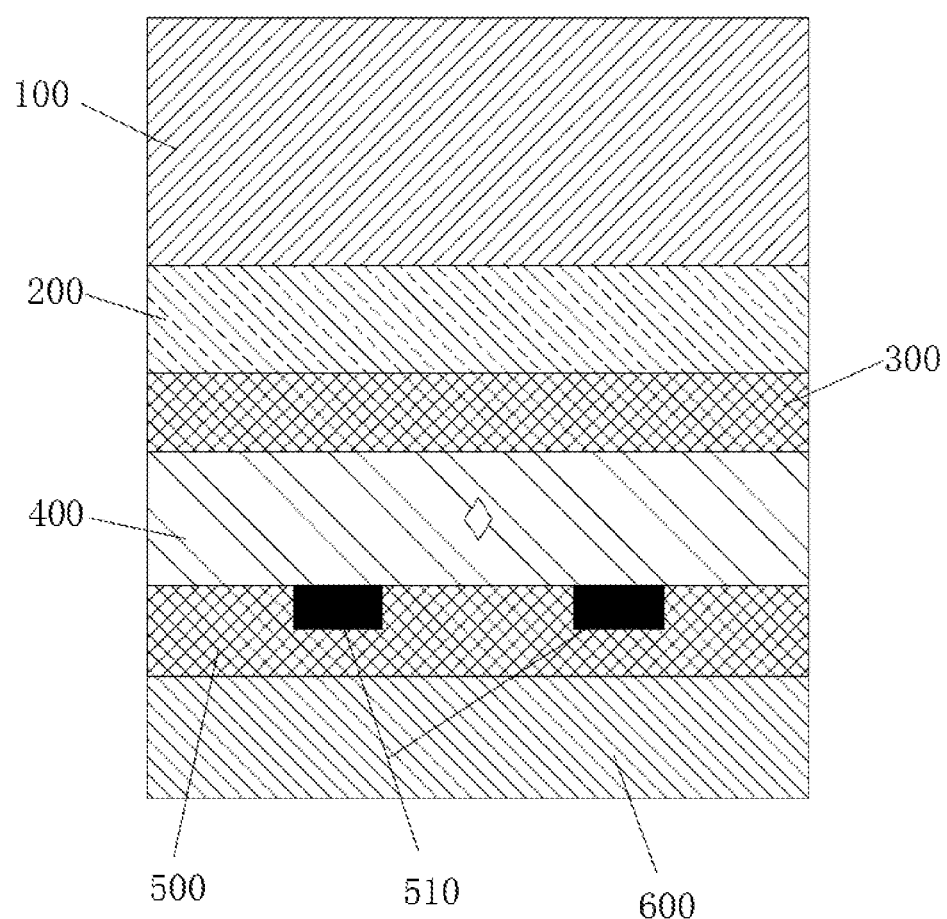
FIG. 2 schematically illustrates vertical polarization of a light source in the perovskite light-emitting diode according to an embodiment of the disclosure.
Figure 3:
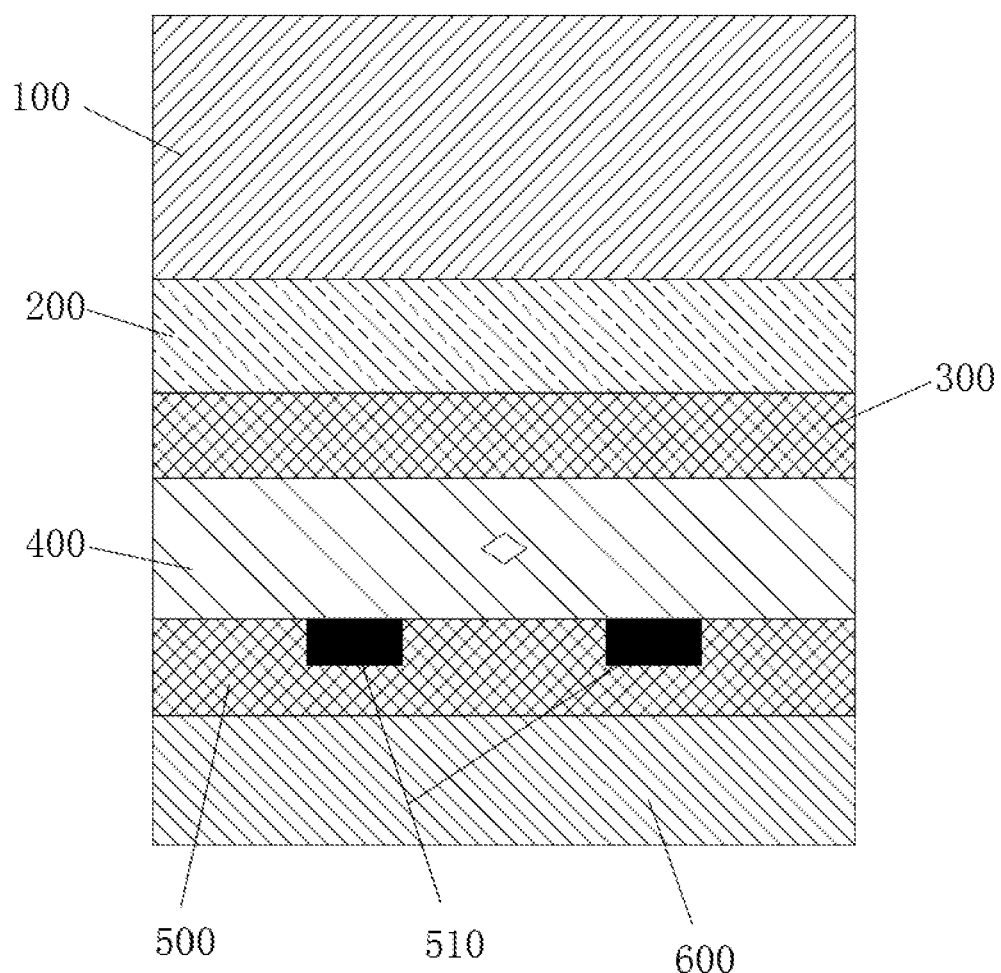
FIG. 3 schematically illustrates horizontal polarization of the light source in the perovskite light-emitting diode according to an embodiment of the disclosure.

In the drawings: 100, glass layer; 200, anode; 300, hole transport layer; 400, emission layer; 410, light source; 500, electron transport layer; 510, periodic nano-grating structure; and 600, cathode.

DETAILED DESCRIPTION OF EMBODIMENTS

The technical solutions of the present disclosure will be described in detail below with reference to the drawings and the embodiments. It should be noted that the embodiments provided below are illustrative to enable those skilled in the art to use and implement the invention, and are not intended to limit the disclosure. It is apparent that those skilled in the art can obtain other embodiments based on the content disclosed herein, and those embodiments made without paying any creative effort should still fall within the scope of the disclosure.

Embodiment 1

Provided herein is a perovskite light-emitting diode with an adjustable light field, including a glass layer 100, an anode 200, a hole transport layer 300, an emission layer 400, an electron transport layer 500 and a cathode 600 in sequence from top to bottom. The electron transport layer 500 is provided with a periodic nano-grating structure 510.

The glass layer 200 is a $SiO_2$ layer with a thickness of 3720 nm. The anode 200 is indium tin oxide (ITO) with a thickness of 100 nm. The hole transport layer 300 is a poly (3,4-ethylenedioxythiophene)/poly(styrenesulfonate) (PEDOT:PSS) layer with a thickness of 65 nm. The emission layer 400 is a perovskite layer with a thickness of 100 nm. The electron transport layer 500 is a [6,6]-phenyl-C61-butyric acid methyl ester (PCBM) layer with a thickness of 85 nm. The cathode 600 is an Al sheet with a thickness of 600 nm.

Embodiment 2

Provided herein is a perovskite light-emitting diode with an adjustable light field, including a glass layer 100, an anode 200, a hole transport layer 300, an emission layer 400, an electron transport layer 500 and a cathode 600 in sequence from top to bottom. The electron transport layer 500 is provided with a periodic nano-grating structure 510.

The periodic nano-grating structure 510 is a periodic ZnO nano-grating structure.

Embodiment 3

The perovskite light-emitting diode provided herein is basically the same as that provided in Embodiment 2 except that the periodic nano-grating structure 510 used herein is a periodic Ag nano-grating structure.

Embodiment 4

The perovskite light-emitting diode provided herein is basically the same as that provided in Embodiment 2 and Embodiment 3 except that the periodic nano-grating structure 510 used herein consists of a metallic periodic nano-grating structure and a dielectric periodic nano-grating structure, where the metallic periodic nano-grating structure is a periodic Ag nano-grating structure, and the dielectric periodic nano-grating structure is a periodic ZnO nano-grating structure.

Embodiment 5

Provided herein is a perovskite light-emitting diode with an adjustable light field, including a glass layer 100, an anode 200, a hole transport layer 300, an emission layer 400, an electron transport layer 500 and a cathode 600 in sequence from top to bottom. The electron transport layer 500 is provided with a periodic nano-grating structure 510.

The periodic nano-grating structure 510 is a periodic ZnO nano-grating structure with a duty ratio of 0.4 and a height of 30 nm.

Embodiment 6

Provided herein is a perovskite light-emitting diode with an adjustable light field, including a glass layer 100, an anode 200, a hole transport layer 300, an emission layer 400, an electron transport layer 500 and a cathode 600 in sequence from top to bottom. The electron transport layer 500 is provided with a periodic nano-grating structure 510.

The periodic nano-grating structure 510 is a periodic ZnO nano-grating structure with a duty ratio of 0.6 and a height of 50 nm.

Embodiment 7

Provided herein is a perovskite light-emitting diode with an adjustable light field, including a glass layer 100, an anode 200, a hole transport layer 300, an emission layer 400, an electron transport layer 500 and a cathode 600 in sequence from top to bottom. The electron transport layer 500 is provided with a periodic nano-grating structure 510.

The periodic nano-grating structure 510 is a periodic ZnO nano-grating structure with a duty ratio of 0.5 and a height of 40 nm.

Embodiment 8

Provided herein is a perovskite light-emitting diode with an adjustable light field, including a glass layer 100, an anode 200, a hole transport layer 300, an emission layer 400, an electron transport layer 500 and a cathode 600 in sequence from top to bottom. The electron transport layer 500 is provided with a periodic nano-grating structure 510.

The emission layer 400 is provided with a horizontally-polarized light source 410.

Embodiment 9

The perovskite light-emitting diode provided herein is basically the same as that in Embodiment 7 except that the emission layer 400 provided herein is provided with a vertically-polarized light source.

Embodiment 10

Provided herein is a perovskite light-emitting diode with an adjustable light field, including a glass layer 100, an anode 200, a hole transport layer 300, an emission layer 400, an electron transport layer 500 and a cathode 600 in sequence from top to bottom. The electron transport layer 500 is provided with a periodic nano-grating structure 510.

Figure 4:
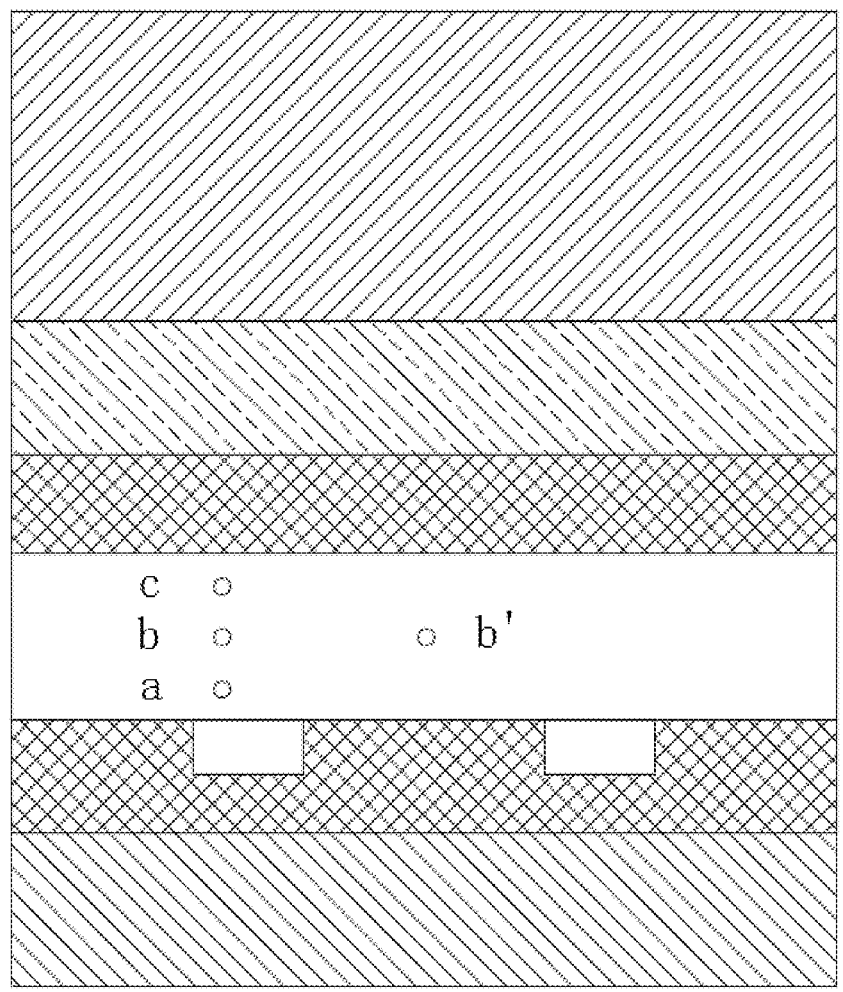
FIG. 4 schematically illustrates different arrangement positions of the light source in an electron transport layer of the perovskite light-emitting diode according to an embodiment of the disclosure.

Referring to FIG. 4, light sources 410 are respectively arranged at positions a, b and c in the emission layer 400.

The performance of the perovskite light-emitting diode is characterized by the far-field radiant intensity, which is calculated by the following formula:

$$|\vec{E}|^2 = \frac{1}{3}(|\vec{E}_x|^2 + |\vec{E}_y|^2 + |\vec{E}_z|^2);$$

In the formula, $|E_x|^2$, $|E_y|^2$ and $|E_z|^2$ respectively represent electric field intensities along the X-axis, Y-axis, and Z-axis. The electric field intensities in the three directions are calculated and averaged to describe the incoherent and random process of emitted photons in the perovskite light-emitting diode.

Figure 6:
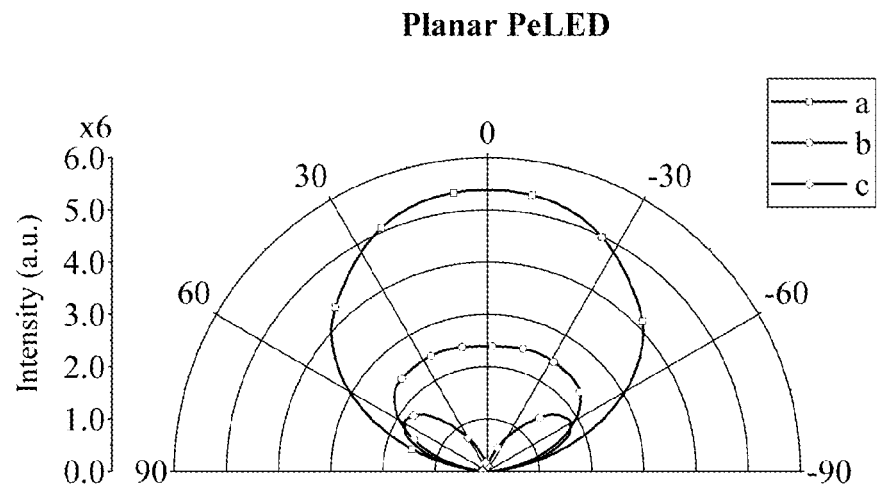
FIG. 6 schematically shows a light radiation intensity of the light source in the perovskite light-emitting diode at different vertical positions according to an embodiment of the disclosure.

FIG. 6 illustrates the comparison of light sources 410 located at positions a, b and c in terms of the light radiation intensity.

Figure 5:
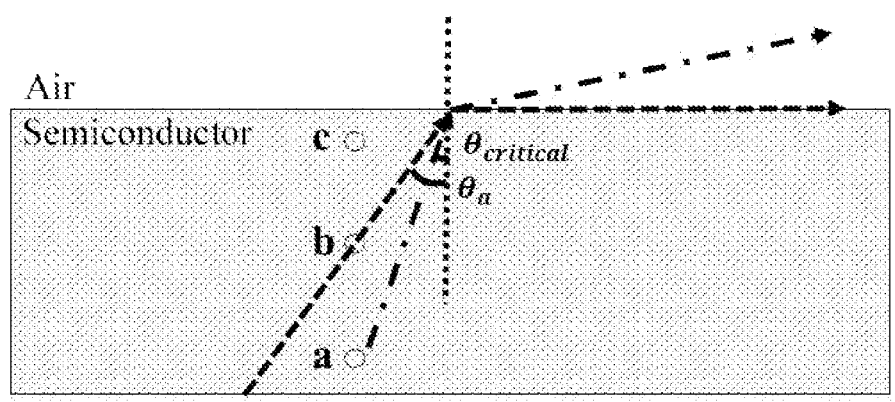
FIG. 5 schematically depicts a total reflection of the perovskite light-emitting diode according to an embodiment of the disclosure.

The planar perovskite light-emitting diodes have typical characteristics of Lambertian radiation mode, that is, the emitted light is uniform in all directions. However, the mismatch of refractive index between different material layers will cause the total reflection, limiting the escape cone (critical angle) in a small range. Referring to FIG. 5, photons with an incident angle less than the critical angle can escape into the air, and those photons with an incident angle larger than the critical angle will be lost in the device in the waveguide mode, resulting in low far-field radiant intensity.

The vertical position of the light source will influence the incident angle of photons, thereby affecting the radiation intensity of the emitted light (as shown in FIG. 6). When the light source is located at a relatively lower position of the light-emitting layer, most of the photons can escape from the perovskite light-emitting diode since their incident angles are less than the critical angle, resulting in higher light extraction intensity. When the light source is located at a relatively higher position in the light-emitting layer, incident angles of most photons are greater than the critical angle, which causes the total reflection, resulting in attenuated radiation intensity. Therefore, optimizing the light source location can effectively enhance the radiation intensity. It can be seen from FIG. 6 that the position a is the optimal vertical arrangement position of the light source.

Figure 7:
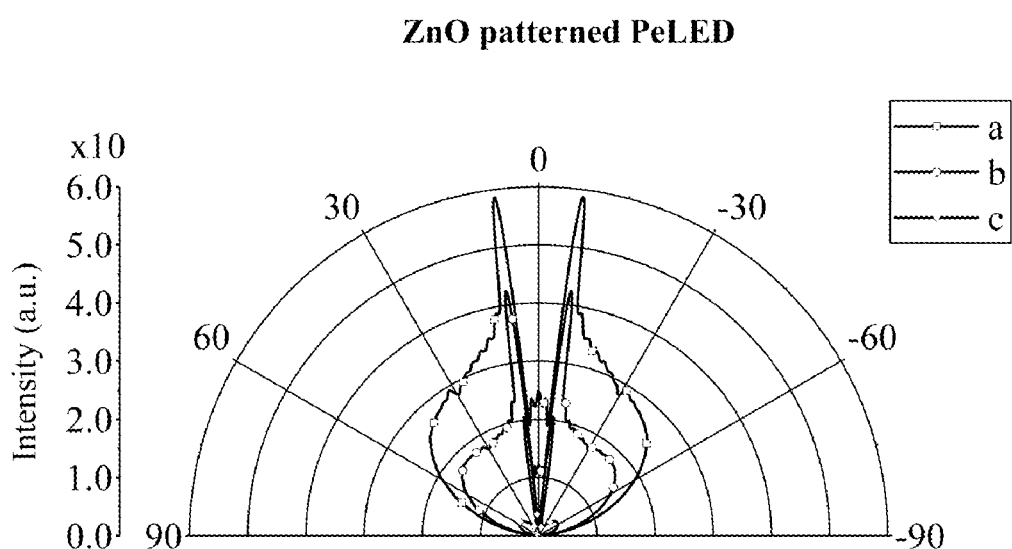
FIG. 7 schematically shows effect of a periodic ZnO nano-grating structure on the light radiation intensity according to an embodiment of the disclosure.

Nevertheless, the far-field radiant intensity of the planar structure is still unsatisfactory. In view of this, a periodic dielectric (ZnO) nanostructure is introduced into the perovskite light-emitting diode to convert the light coupled to the waveguide mode into the transmissible light to improve the efficiency of the perovskite light-emitting diode. It can be seen from FIG. 7 that the introduction of the periodic nanostructure into the electron transport layer can significantly increase the intensity of light extraction. With regard to the perovskite light-emitting diode, where the electron transport layer is provided with the dielectric periodic nano-grating structure, the closer the light source gets to the cathode in a vertical direction (the vertical direction shown in FIG. 4), the better the light extraction efficiency. As shown in FIGS. 4 and 7, the light extraction efficiency is the largest at the position a, followed by position b and position c.

Embodiment 11

Provided herein is a perovskite light-emitting diode with an adjustable light field, including a glass layer 100, an anode 200, a hole transport layer 300, an emission layer 400, an electron transport layer 500 and a cathode 600 in sequence from top to bottom. The electron transport layer 500 is provided with a periodic nano-grating structure 510.

Figure 8:
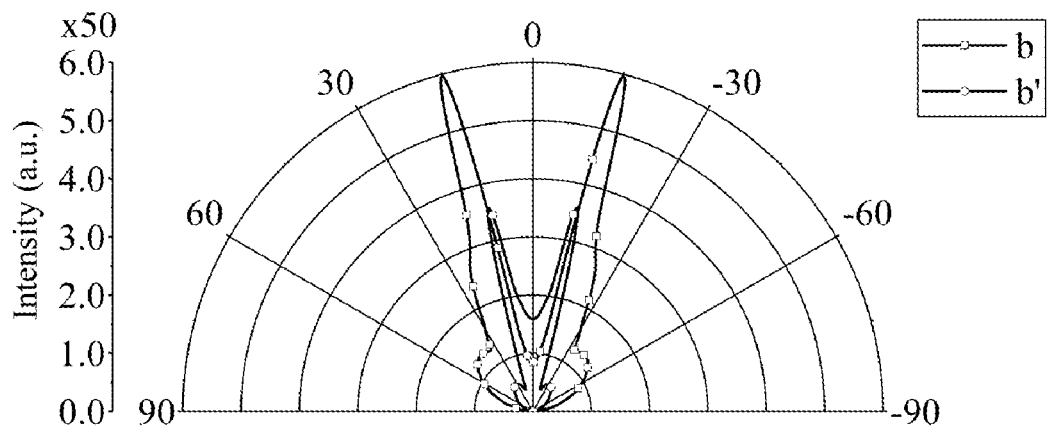
FIG. 8 schematically shows effect of the horizontal position of the light source on a far-field intensity of an Ag perovskite light-emitting diode according to an embodiment of the disclosure.
Figure 9:
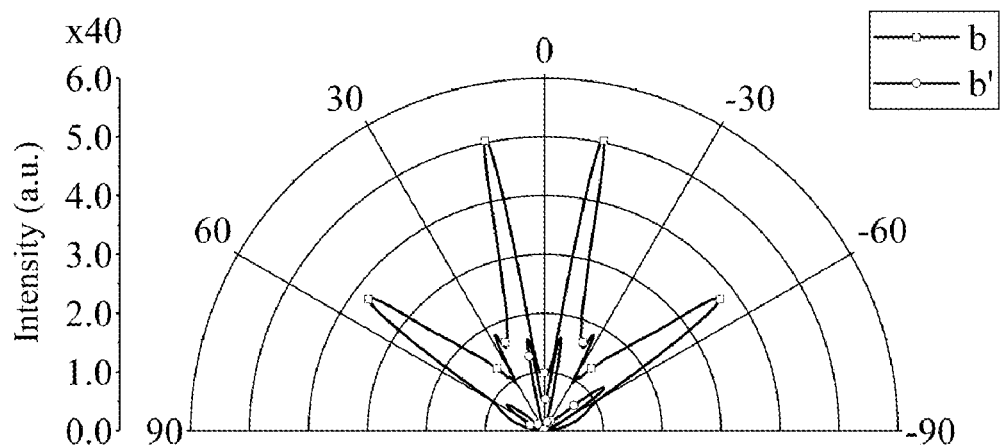
FIG. 9 schematically shows effect of the horizontal position of the light source on a far-field intensity of a perovskite light-emitting diode provided with a metallic periodic nano-grating structure and a dielectric periodic nano-grating structure (a periodic Ag nano-grating structure and a periodic ZnO nano-grating structure) according to an embodiment of the disclosure.

FIG. 8 schematically shows the effect of the horizontal position of the light source on the far-field intensity of the Ag perovskite light-emitting diode. FIG. 9 schematically shows the effect of the horizontal position of the light source on the far-field intensity of the perovskite light-emitting diode provided with a metallic periodic nano-grating structure and a dielectric periodic nano-grating structure (a periodic Ag nano-grating structure and a periodic ZnO nano-grating structure).

It can be concluded from the FIGS. 8-9 that with regard to the perovskite light-emitting diode in which the electron transport layer is provided with the metallic periodic nano-grating structure, the closer the light source gets to the metallic periodic nano-grating structure (the left nano-grating structure in FIG. 4) in a horizontal direction (parallel to the light emitting layer), the better the light extraction efficiency; and as shown in FIGS. 4, 8 and 9, the light extraction efficiency is b>b'. With regard to the perovskite light-emitting diode in which the electron transport layer is provided with the dielectric periodic nano-grating structure (the right nano-grating structure in FIG. 4) and the metallic periodic nano-grating structure (the left nano-grating structure in FIG. 4), when the light source is arranged directly above the metallic periodic nano-grating structure, the light extraction efficiency is optimal. The position directly above the metallic periodic nano-grating structure is the optimal illumination position of the light source.

The effect of the horizontal position of the light source on the Ag perovskite light-emitting diode and the Ag—ZnO perovskite light-emitting diode is further studied. The results demonstrate that the intensity of the light source located between two gratings is lower than that of the light source located directly above the grating, and the light emitted from the perovskite light-emitting diode with a grating structure including the dielectric periodic nano-grating structure and the metallic periodic nano-grating structure has four obvious directional angles.

Embodiment 12

Provided herein is a perovskite light-emitting diode with an adjustable light field, including a glass layer 100, an anode 200, a hole transport layer 300, an emission layer 400, an electron transport layer 500 and a cathode 600 in sequence from top to bottom. The electron transport layer 500 is provided with a periodic nano-grating structure 510.

Figure 10:
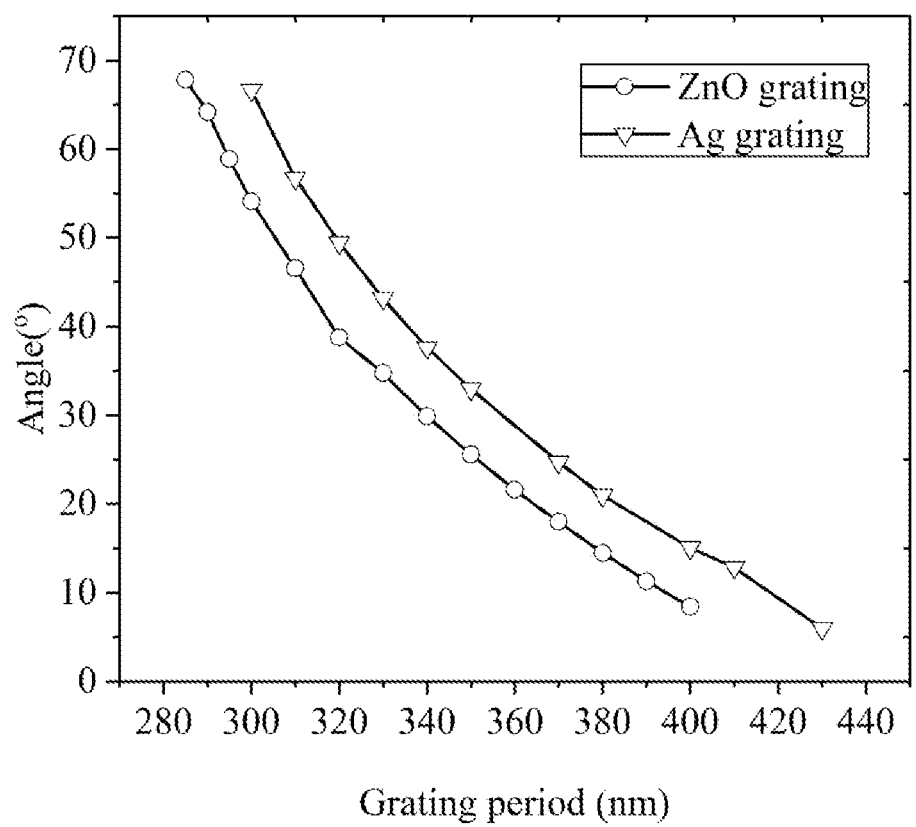
FIG. 10 schematically depicts angles of an emergent light of the perovskite light-emitting diode under different grating periods.

A dielectric (ZnO) nano-grating structure is introduced into the electron transport layer 500 of the planar perovskite light-emitting diode, where the ZnO grating has a duty ratio of 0.5 and a height of 40 nm, and the grating period can be adjusted within a range of 300-400 nm. An Ag nano-grating structure with the same parameters as the ZnO nano-grating structure is introduced into the electron transport layer of the planar perovskite light-emitting diode. FIG. 10 schematically depicts the angles of the light emitted from the perovskite light-emitting diode with different grating periods. It can be seen that the maximum modulation angle of the dielectric (ZnO) grating can reach 70°, enabling the angle modulation in a larger range.

Embodiment 13

Figure 11:
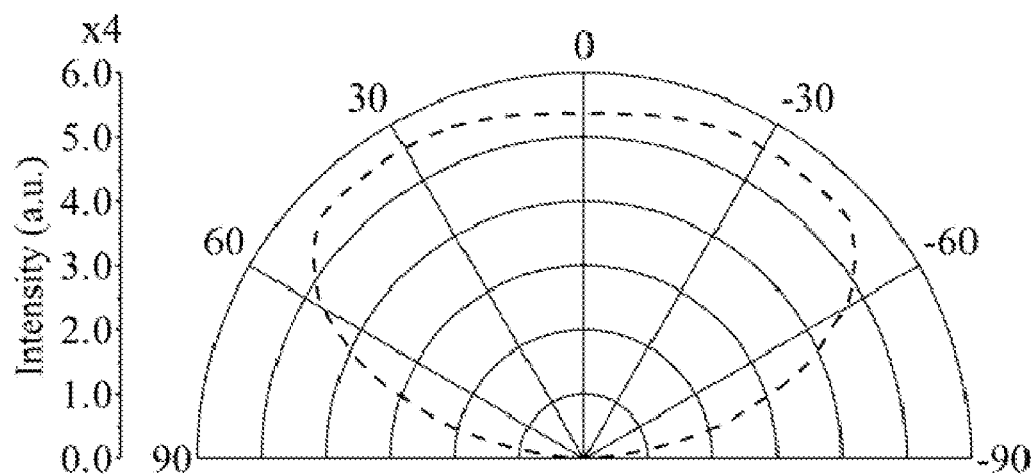
FIG. 11 schematically shows the effect of the horizontal polarization mode of the light source in the perovskite light-emitting diode on the light radiation intensity according to an embodiment of the disclosure.
Figure 12:
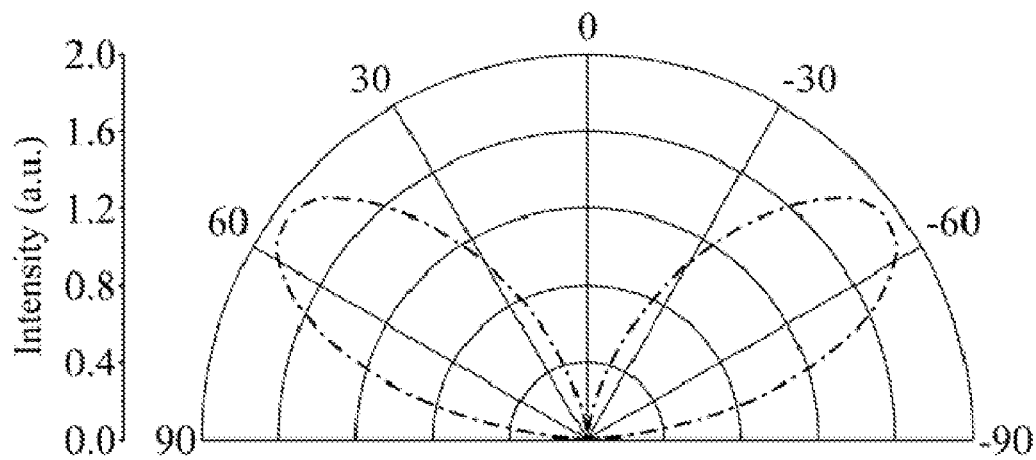
FIG. 12 schematically shows the effect of the vertical polarization mode of the light source in the perovskite light-emitting diode on the light radiation intensity according to an embodiment of the disclosure.

Referring to FIG. 11 and FIG. 12, this embodiment mainly demonstrates the effect of the polarization mode of the light source on the light radiation intensity.

The effects of horizontal and vertical polarization modes of the light source on the perovskite light-emitting diodes with different grating structures are compared. It can be seen that the light source brings stronger light radiation in the horizontal polarization mode compared with the vertical polarization, which can be explained by that in the horizontal polarization mode, more photons have an incident angle less than the critical angle, while in the vertical polarization mode, photons are trapped in the perovskite layer and substrate in the form of oblique incidence and finally lost in the perovskite light-emitting diode, resulting in lower far-field radiant intensity. Therefore, the horizontal polarization mode is preferred.

In conclusion, three types of nano-grating structures, i.e., a dielectric (ZnO) periodic nano-grating structure, a metallic (Ag) periodic nano-grating structure and a nano-grating structure including the dielectric (ZnO) periodic nano-grating structure and the metallic (Ag) periodic nano-grating structure, are respectively incorporated into the perovskite light-emitting diode to achieve the directional emission of the light, which provides an effective method for modulating the emergent angle of the light emitted by the perovskite light-emitting diode, and also provides technical reference for the controlling of spontaneous radiation. The improved method provided herein is of great significance in the application of optoelectronic parts with unique functions.

This application introduces a nano-grating structure into the perovskite light-emitting diode, which can effectively damage the waveguide mode of light transmission in the perovskite light-emitting diode, and couple the waveguide mode into the substrate mode to increase the efficiency of light extraction. In addition, the emitting angle of the emergent light can be adjusted continuously, remarkably enhancing the performance of the perovskite light-emitting diode.

Apparently, the above-mentioned embodiments are merely some embodiments of the disclosure, and are not intended to limit the disclosure. It should be understood that other embodiments obtained by those skilled in the art based on the content disclosed herein without paying any creative effort should fall within the scope of the disclosure. Unless otherwise specified, the structures, devices and operating methods that are not specified in detail, are implemented following the conventional means in the art.

What is claimed is:

1. A perovskite light-emitting diode with an adjustable light field, comprising:
   a glass layer;
   an anode;
   a hole transport layer;
   an emission layer;
   an electron transport layer; and
   a cathode;
   wherein the glass layer, the anode, the hole transport layer, the emission layer, the electron transport layer and the cathode are successively arranged from top to bottom; and the electron transport layer is provided with a periodic nano-grating structure.

2. The perovskite light-emitting diode of claim 1, wherein the periodic nano-grating structure is a dielectric periodic nano-grating structure.

3. The perovskite light-emitting diode of claim 2, wherein the dielectric periodic nano-grating structure is a periodic ZnO nano-grating structure.

4. The perovskite light-emitting diode of claim 3, wherein the periodic ZnO nano-grating structure has a duty ratio of 0.4-0.6 and a height of 30-50 nm.

5. The perovskite light-emitting diode of claim 1, wherein the periodic nano-grating structure is a metallic periodic nano-grating structure.

6. The perovskite light-emitting diode of claim 5, wherein the metallic periodic nano-grating structure is a periodic Ag nano-grating structure.

7. The perovskite light-emitting diode of claim 1, wherein the periodic nano-grating structure consists of a dielectric periodic nano-grating structure and a metallic periodic nano-grating structure.

8. The perovskite light-emitting diode of claim 7, wherein the metallic periodic nano-grating structure is a periodic Ag nano-grating structure; and the dielectric periodic nano-grating structure is a periodic ZnO nano-grating structure.

* * * * *